(12) United States Patent
Lowry et al.

(10) Patent No.: US 11,154,039 B2
(45) Date of Patent: Oct. 26, 2021

(54) LED TERRARIUM LIGHT FOR REPTILES, AMPHIBIANS, AND BIRDS, USING AN EXTENDED POINT SOURCE LED ARRAY WITH LIGHT EMITTING DIODES OF MULTIPLE WAVELENGTHS

(71) Applicant: DICON FIBEROPTICS, INC., Richmond, CA (US)

(72) Inventors: David Lowry, Pinole, CA (US); Jeffrey B. Lee, El Sobrante, CA (US); Robert E. Schleicher, Danville, CA (US); Ho-Shang Lee, El Sobrante, CA (US)

(73) Assignee: DICON FIBEROPTICS, INC., Richmond, CA (US)

( * ) Notice: Subject to any disclaimer, the term of this patent is extended or adjusted under 35 U.S.C. 154(b) by 149 days.

(21) Appl. No.: 16/251,460

(22) Filed: Jan. 18, 2019

(65) Prior Publication Data

US 2020/0229405 A1 Jul. 23, 2020

(51) Int. Cl.
*A01K 63/06* (2006.01)
*F21V 5/04* (2006.01)
(Continued)

(52) U.S. Cl.
CPC ............... *A01K 63/06* (2013.01); *F21V 5/04* (2013.01); *F21V 7/04* (2013.01); *F21V 21/088* (2013.01); *F21V 21/32* (2013.01); *F21V 23/004* (2013.01); *F21V 29/677* (2015.01); *F21V 29/745* (2015.01); *H05B 45/10* (2020.01); *H05B 47/19* (2020.01); *F21Y 2113/13* (2016.08); *F21Y 2115/10* (2016.08); *H01L 33/502* (2013.01)

(58) Field of Classification Search
CPC ..... A01K 63/06; F21V 29/677; F21V 29/745; F21V 5/04; F21V 7/04; F21V 21/088; F21V 21/32; F21V 23/004; H05B 47/19; H05B 45/10
See application file for complete search history.

(56) References Cited

U.S. PATENT DOCUMENTS

| 6,166,496 | A | * | 12/2000 | Lys | ............. | G09G 3/2014 |
| | | | | | | 315/316 |
| 6,211,626 | B1 | * | 4/2001 | Lys | ............. | A61N 5/0618 |
| | | | | | | 315/291 |

(Continued)

FOREIGN PATENT DOCUMENTS

WO    WO2015/077734 A1    5/2015

*Primary Examiner* — Mary Ellen Bowman
(74) *Attorney, Agent, or Firm* — Vierra Magen Marcus LLP

(57) ABSTRACT

Examples of electrical lamp fixtures for illuminating terrariums and stimulating the growth and health of reptiles, amphibians, and birds, and specifically to an improved, compact light emitting diode (LED) terrarium light apparatus are described. The lighting apparatus can incorporate one or multiple extended point source LED arrays, such as composed of high brightness LEDs of multiple wavelengths, that provide spatially and spectrally controlled light. A compact, high brightness LED terrarium light apparatus for reptiles and birds, comprises an array of multiple LED chips that provides visible light, ultraviolet light, and (optionally) infrared light, with separate control of the various spectral components.

35 Claims, 11 Drawing Sheets

(51) Int. Cl.
*F21V 23/00* (2015.01)
*F21V 7/04* (2006.01)
*F21V 29/67* (2015.01)
*F21V 21/32* (2006.01)
*F21V 21/088* (2006.01)
*F21V 29/74* (2015.01)
*H05B 45/10* (2020.01)
*H05B 47/19* (2020.01)
*H01L 33/50* (2010.01)
*F21Y 115/10* (2016.01)
*F21Y 113/13* (2016.01)

(56) References Cited

U.S. PATENT DOCUMENTS

| | | | |
|---|---|---|---|
| 8,444,304 B2 | 5/2013 | Wang | |
| 8,568,009 B2 | 10/2013 | Chiang et al. | |
| 2003/0076281 A1* | 4/2003 | Morgan | F24C 7/004 |
| | | | 345/44 |
| 2005/0236998 A1* | 10/2005 | Mueller | H05B 45/20 |
| | | | 315/51 |
| 2006/0271340 A1* | 11/2006 | Levine | A01K 63/06 |
| | | | 702/188 |
| 2010/0204841 A1* | 8/2010 | Chemel | H05B 45/20 |
| | | | 700/282 |
| 2012/0206911 A1* | 8/2012 | Pickard | F21S 8/026 |
| | | | 362/231 |
| 2019/0320627 A1* | 10/2019 | Lawyer | G02B 6/0055 |

* cited by examiner

US 11,154,039 B2

LED TERRARIUM LIGHT FOR REPTILES, AMPHIBIANS, AND BIRDS, USING AN EXTENDED POINT SOURCE LED ARRAY WITH LIGHT EMITTING DIODES OF MULTIPLE WAVELENGTHS

BACKGROUND

This disclosure relates generally to electrical lamp fixtures used for illuminating terrariums and stimulating the growth and health of reptiles, amphibians, and birds.

Typical terrarium lights intended for use with reptiles, amphibians, and to some extent birds, utilize either fluorescent bulbs, halogen incandescent bulbs, metal halide (MH) incandescent bulbs, or some combination of these bulb types. The primary purpose of most terrarium lights is to provide an attractive illumination of the terrarium and its contents, for viewing. In addition, terrarium lights also support the growth and health of living animals and organisms, such as reptiles, amphibians, and birds, as well as any plant life that is included. The objectives and characteristics of light sources for achieving these two broad purposes can be substantially different, and the different types of light sources used in existing terrarium lights (or reptile, amphibian, and bird lights) have differing advantages and disadvantages in meeting these objectives.

SUMMARY

In one set of embodiments, a lighting apparatus includes a substrate and a two dimensional array of a plurality of light emitting diode (LED) chips arranged laterally upon and attached to a surface of the substrate. The array of LED chips is arranged to emit light transversely to the surface of the substrate and includes one or more strings of LED chips configured to emit white light or almost white light and one or more strings of ultraviolet (UV) LED chips configured to emit light with a wavelength less than 400 nm. Each of the one or more strings of LED chips configured to emit white or almost white light and the one or more strings of UV LED chips is independently drivable. An optical lens adjacent to the substrate and covering the array is configured to collect and direct light emitted from the plurality of LED chips transversely to the surface of the substrate.

Various aspects, advantages, features and embodiments are included in the following description of examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Figure 1:
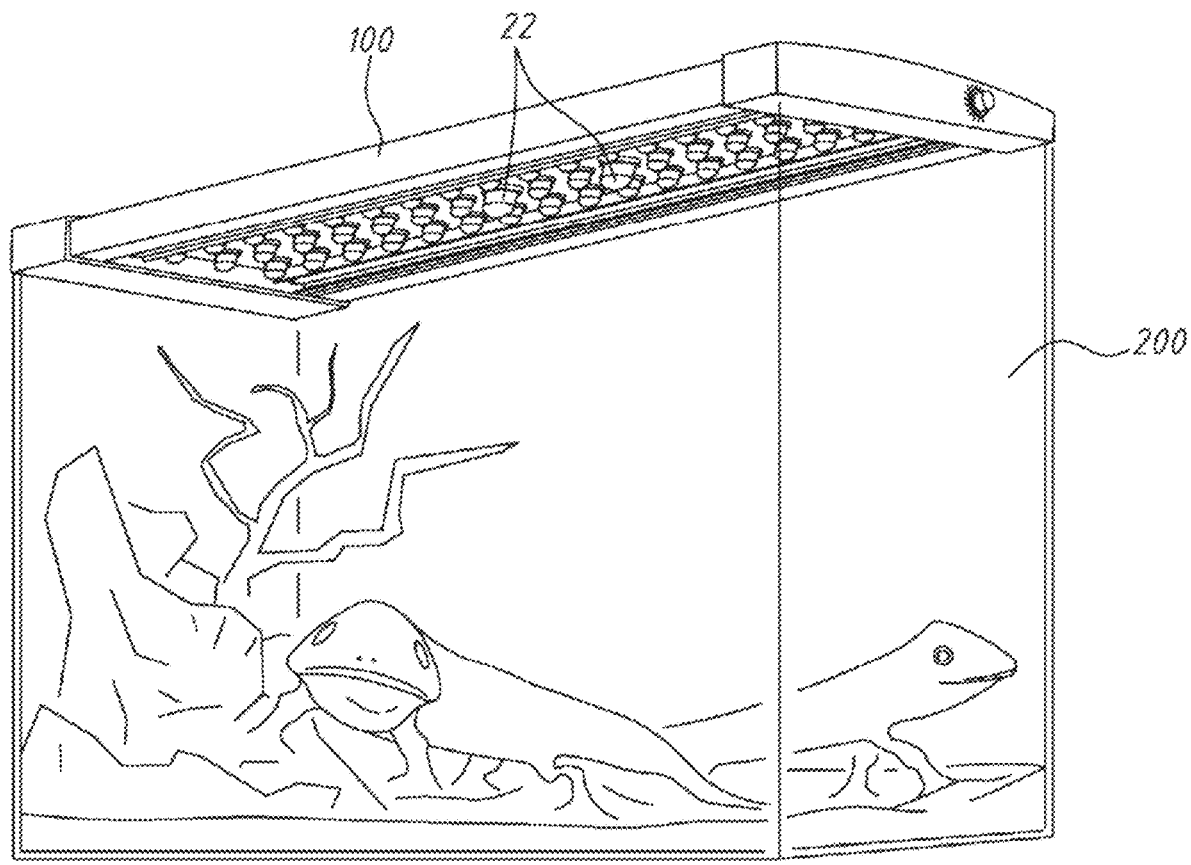
FIG. 1 shows a reptile light of the prior art, using LEDs for visible light, and phosphor-coated cold cathode tubes for UV light.

The following presents embodiments of electrical lamp fixtures for illuminating terrariums and stimulating the growth and health of reptiles, amphibians, and birds, and specifically to an improved, compact light emitting diode (LED) terrarium light apparatus, incorporating one or multiple extended point source LED arrays, such as composed of high brightness LEDs of multiple wavelengths, that provide spatially and spectrally controlled light. More specifically, a compact, high brightness LED terrarium light apparatus for reptiles and birds, comprises an array of multiple LED chips without individual packaging, wherein the LED chips are distributed laterally over an area. The LED chips have light emitting surfaces for emitting light in directions transverse to said area. The apparatus further includes an optical lens adjacent to the light emitting surfaces of the LED chips in said array. The optical lens collects and directs light emitted by the LED chips of the array towards the surface of the terrarium tank. The apparatus can also include a reflector surrounding said array. The reflector reflects the light emitted by the LED chips of the array towards the surface of the terrarium tank. Both the optical lens and reflector are configured to serve to attractively illuminate the contents of the terrarium tank, and to enhance the growth and health of animal and plant life within the terrarium tank. The compact size of the apparatus supports a variety of mounting options that do not appreciably block access to the top of the terrarium tank, for viewing, and for terrarium maintenance tasks. The array of LED chips provides visible light, ultraviolet light, and (optionally) infrared light, with separate control of the various spectral components.

Typical terrarium lights intended for use with reptiles, amphibians, and to some extent birds, utilize either fluorescent bulbs, halogen incandescent bulbs, metal halide (MH) incandescent bulbs, or some combination of these bulb types. The primary purpose of most terrarium lights is to provide an attractive illumination of the terrarium and its contents, for viewing. In addition, terrarium lights also support the growth and health of living animals and organisms, such as reptiles, amphibians, and birds, as well as any plant life that is included. The objectives and preferred characteristics of light sources for achieving these two broad purposes can be substantially different, and the different types of light sources used in existing terrarium lights (or reptile, amphibian, and bird lights) have differing advantages and disadvantages in meeting these objectives. In the discussion that follows, the primary focus will be on lighting for reptile habitats, although considerations for amphibian and bird habitats as well as other forms of terrariums will also be discussed.

It should also be noted that there are a variety of names used for reptile, amphibian, and bird habitats, or more generally, for the habitats of living organisms, with varying degrees of specificity. The most general term is "vivarium", which refers to an enclosure or area for any sort of plant or animal. The term "terrarium" is most frequently applied to habitats for reptiles and amphibians, using a tank that is similar to the tanks used for aquariums. The term "paludarium" refers to an enclosure that contains both terrestrial and aquatic elements, essentially a combination of a terrarium and an aquarium. Paludariums are especially applicable to amphibians, which lay eggs in water, and also need a generally moist environment. Birds are often kept in bird cages, rather than terrarium tanks, and larger bird cages or enclosures are often referred to as aviaries. The scope of the following disclosure includes lighting for these other forms of enclosures or habitats.

Among the characteristics desired of a light source intended for providing an attractive source of illumination for viewing a terrarium, is the provision of a spectral content that is reasonably close to that of natural sunlight, including having a reasonably high color rendering index (CRI). This results in a natural appearance for animals and plant life in the terrarium. Some terrarium owners and reptile, amphibian, or bird enthusiasts also place value on a light source or lighting system in which the nature of the light can be varied over time, to mimic the differences in sunlight at different times of day.

Another key attribute for terrarium viewing is the spatial distribution of the light from the light source. Light that appears to emanate from a point source, or an approximation of a point source, creates a more natural appearance and shadowing within the terrarium. In contrast, a light source that is broadly distributed over the top of the terrarium will result in multiple shadows, or very indistinct shadows with limited contrast, which can appear unnatural. This is related to the observation that natural sunlight (which emanates from a near point source) creates very sharp and distinct shadows, whereas a distributed light source creates either multiple shadows, or highly-blurred and indistinct shadows. Existing terrarium light sources that approximate a point source of light, such as a single incandescent bulb, therefore provide an attractive or natural shadowing effect, whereas more distributed light sources, such as a long fluorescent tube, do not provide an attractive shadowing effect.

Although aquarium and terrarium tanks have some similarities, the preferred characteristics of a light source intended for the growth and health of terrarium plants and animals may be somewhat different from the characteristics that are desired for aquarium viewing. Different types of terrarium life will prefer different specific wavelengths of light, both in terms of encouraging growth and health, and also in terms of encouraging specific behaviors and effects. It may also be beneficial to be able to vary the spectral content of the light source over time, for example to mimic the day-night cycle, or even seasonal variations that occur in nature. In terms of the light source's spatial distribution, the preferred characteristics include high intensity, as well as uniformity of both the spectral content and intensity over a reasonably large area.

Non-visible spectral content is also desirable for the health of reptiles, amphibians, and birds, and may also affect behavior. Heat lamps are often used with reptiles, and to some extent amphibians, due to their cold-blooded nature. Incandescent bulbs providing visible light also provide substantial amounts of infrared light, and therefore act as heat lamps. However, in some cases it is desirable to provide heat without visible light, and so prior art lighting for reptiles sometimes makes use of special heat lamp bulbs, providing infrared light with limited amounts of visible light.

Ultraviolet light is also important for the health of reptiles, and may also affect the behavior of both birds and reptiles. The eyes of many reptile and bird species are sensitive to ultraviolet light, typically in the UVA wavelength range (approximately 315 to 400 nm). Many reptile and bird enthusiasts believe that providing UVA light is important to the behavior of their reptiles and birds, as it allows the reptiles and birds to see things more similarly to how they would see them in natural sunlight. It is also believed that some amount of UVB light (with wavelengths in the range of 280 to 315 nm) is beneficial to the synthesis of Vitamin D3 in reptiles. Because of these benefits, prior art lighting for reptiles and birds often includes a separate bulb (a so-called "black light" bulb) for providing UVA light, and sometimes UVB light as well. (In contrast, UVB light may be harmful to amphibians, especially to amphibian eggs.)

One complicating factor in providing UV light for birds and reptiles (especially reptiles) is that for some species, too much UV can be harmful to their eyes. For this reason, some reptile species have evolved heavily hooded "eyebrows" over their eyes, to protect their eyes from excessive UV in strong mid-day sunlight. For these species, artificial UV lighting should be located "overhead", so that the reptile's eyebrows will shield their eyes. A single point source for the UV light, rather than a more distributed light source, such as a tube or panel, may make it easier for the reptile(s) to adopt a position in the terrarium that shields their eyes from excessive UV light.

Due to the inherent complications in providing a terrarium light source that meets all of the desired attributes, and provides a spectrum that includes high quality visible light, plus UV light, plus (in the case of reptile and amphibian lights) infrared, prior art terrarium lights have used multiple light sources, housed in a common housing. For example, a light fixture for a reptile habitat might include three separate incandescent bulbs for visible light, UVA and UVB, and infrared light. Incandescent bulbs are not very energy efficient, and so fluorescent bulbs may be used for one or two of the desired wavelength ranges, but have their own disadvantages, such as providing a very spatially-distributed light.

It is also desirable for a terrarium light to have a compact form factor, so that the light does not cover a high percentage of the top of the terrarium tank. A terrarium light with a compact form factor will provide less-obstructed viewing of the terrarium from above, and will also make activities such as feeding, tank cleaning, and other terrarium maintenance tasks less difficult. The compact form factor also contributes to the terrarium light behaving approximately as a point source of light, similar to the sun. Other desirable attributes for a preferred terrarium light for reptiles, amphibians, and birds include low cost, low electrical power consumption, low or reduced heat generation (except when desired, in the form of radiated infrared light), high reliability, and long life.

Existing terrarium lights and terrarium light source technologies have different advantages and disadvantages, for the dual purposes of providing an attractive source of illumination for terrarium viewing, and encouraging the growth and health of reptiles, amphibians, birds, and plants. Fluorescent bulbs, as well as incandescent bulbs, such as halogen and metal halide light sources, provide a fairly broad spectrum of light, and can provide good or at least acceptable color rendering. However, their spectral content is fixed. Thus, varying the spectral content over time is not possible, unless multiple bulb types are incorporated into the light. It is also not possible to tailor the spectral content to emphasize the specific wavelengths that might be optimal for the growth and health of various lifeforms. It is also true that incandescent bulbs in particular (and fluorescent bulbs to a lesser extent) may produce significant quantities of radiated infrared energy. This may be desirable for reptiles, but the amount of radiated infrared energy is not controllable. And, in the case of birds, it may not be desirable.

In terms of spatial distribution, incandescent bulbs can be configured to approximate a point source, and therefore can provide an attractive and natural shadowing effect. However, fluorescent bulbs typically provide a more distributed light pattern, and do not provide attractive shadowing. As a result of these differences in characteristics, some terrarium light fixtures incorporate both incandescent and fluorescent bulbs, to be used at different times for differing purposes.

Terrarium lights using light emitting diodes (LEDs) for at least part of their emissions spectrum offer a number of potential advantages over fluorescent or incandescent bulbs. Several of these general advantages are described in U.S. Pat. No. 8,444,304 B2, "REPTILE LAMP", Yu-Chin Wang, Issued May 21, 2013, and in International Application (WIPO/PCT) Publication Number WO 2015/07734 A1, "OPTIMIZED SPECTRUM REPTILE LAMP", John Petrak and Gina C. Lowers, Published May 28, 2015. First and foremost of the general advantages of LED terrarium lights is that individual LEDs emit light over a narrow range of wavelengths. By combining multiple LEDs of specific wavelengths, it is possible to tailor the overall spectral content of the light source, for either a particular visual appearance, or for encouraging the growth and health of reptiles (and birds), as well as plant life. If the control electronics for the LED terrarium light are designed so that the brightness of different wavelength LEDs is separately controllable, then it is also possible to vary the spectral content of the overall LED light source as a function of time, to mimic the day-night cycle, or even the changes that occur in natural sunlight as a function of time-of-day. Since LED chips only emit light from their top surfaces, LED-based light sources tend to require simpler reflectors than incandescent or fluorescent bulbs. Other general benefits of LED terrarium lights include high efficiency, especially when compared to incandescent bulbs, as well as the lack of uncontrolled radiated IR energy that could provide excessive heat in the terrarium.

However, existing LED (or, more precisely, partial-LED) terrarium/reptile lights also suffer from several important disadvantages. The primary historical disadvantage of existing and prior art LED lights in general has been their relative lack of total light output, compared to fluorescent and incandescent light sources. Research in LEDs and solid-state lighting has resulted in the development of high brightness LEDs that efficiently produce relatively larger levels of light output, at higher electrical current levels. This has largely been achieved via advances in drawing heat away from the active junction of the LED, thereby allowing the LED to safely operate at these higher current levels. The electrical-to-optical conversion efficiency of LEDs is also being improved over time.

However, in order to provide a sufficient total light output, prior art LED terrarium lights require relatively large numbers of LEDs, which are typically spaced widely apart in order to deal with the resultant heat dissipation issues, or the use of LEDs for only a portion of the desired spectrum, to be combined with traditional incandescent or fluorescent bulbs. The spacing between adjacent LEDs or LED chips in prior art LED terrarium lights is therefore an inch or more in most cases, and is typically several inches. This negates much of the potential size and cost advantages of an LED terrarium light. In order to achieve the light output of 20 or more LED chips, the surface area of the prior-art LED terrarium light must be relatively large. Also, each of the widely-spaced LED chips requires individual separate packaging, separate heat-sinking, and separate optics, thereby adding significantly to the size and cost of the grow light.

Typical practice in existing LED terrarium lights is to distribute a large number of individually-packaged LEDs along the length and width of a "light panel", or alternatively, along the length of a "light bar". This creates a highly distributed spatial light pattern, similar to that provided by the use of one or more long fluorescent tubes. This highly distributed light pattern does not provide the attractive shadowing effect that would result from a point source of light. Also, if multiple wavelengths of LEDs are being used to achieve a desirable spectral profile, the different wavelengths will be positioned at different locations along the light panel or light bar. This results in poor mixing of the light from the spatially separated LEDs, causing different areas of the terrarium tank to receive light with differing spectral content. The large size of LED light panels and light bars also covers up a large portion of the top surface of the terrarium, blocking viewing of the terrarium from above, and blocking access for terrarium maintenance and other tasks.

The following presents embodiments of a compact, high brightness LED terrarium light, using an extended point source LED array made up of light emitting diodes of multiple wavelengths, addresses the disadvantages of prior art terrarium lights, including prior art terrarium lights that combine LEDs and other forms of light bulbs, while at the same time providing the advantages that are generally applicable to LED lights. The ideal LED terrarium light would be compact, and yet it would provide a very intense light. It would be very efficient at converting electrical energy into light energy that provides a visually attractive illumination of the terrarium tank and its contents, and is also maximally useful for encouraging the growth of terrarium life such as reptiles, amphibians, birds, and plants, while providing minimal levels of light and heat energy that are not useful for these desired purposes. It would allow flexible customization of specific wavelengths and spectral content for promoting specific reptile (as well as amphibian and bird) growth patterns and behaviors, with dynamic control capabilities to vary its light output over time (both in terms of spectral content, as well as intensity). It would also offer flexible mounting options, to support a variety of terrarium tank styles and environments. It could be used as the sole source of light for the terrarium, or as a supplement for natural sunlight or other existing light sources. When used as a supplement for natural lighting, the ideal LED terrarium light would not block or shade the top surface of the terrarium tank to any great degree. The compact size of the ideal LED terrarium light would leave most of the top surface of the terrarium tank open and unblocked, both for viewing purposes, and also to allow activities such as feeding, tank cleaning, and other terrarium maintenance tasks. Other highly desirable attributes include low cost, low electrical power consumption, high reliability, and long life.

Prior art terrarium lights that make use of LEDs typically possess one or more significant shortcomings. In many cases these shortcomings are based on their use of large numbers of widely-spaced, separately packaged LEDs, as well as their use of simple control systems with little flexibility. Prior art terrarium lights that make use of LEDs are typically implemented as large light panels, typically one foot to four feet in length, depending on the length of the terrarium tank, or as long light bars, again with length dimensions of one or more feet. The light bar form implements a single row of widely-spaced, separately-packaged LEDs, and it is difficult to obtain sufficient light output, as well as an even, well-mixed, spatial distribution of light intensity. The light panel form, by providing space for multiple rows of widely-spaced, separately-packaged LEDs, can provide more total light output, with a somewhat more even or uniform spatial distribution. However, the large panel form incurs additional cost, and also covers all or most of the top of the terrarium tank, limiting access to the top of the terrarium for viewing, as well as the feeding of terrarium animals, and terrarium maintenance tasks. Both the light bar and light panel forms typically suffer from the general disadvantages of high cost and relatively large size. Much of the cost and size disadvantage is directly due to the need to space the individual LED chips relatively far apart, with separate chip packaging, heat-sinking, and optics. The use of incandescent or fluorescent bulbs in prior art terrarium lights incurs similar disadvantages.

Embodiments presented here make use of a dense array of multiple closely-spaced LED chips without individual packaging, which array acts as an "extended point source" of light. Instead of packaging each individual LED chip separately, a housing encloses the array of multiple LED chips as described below. The LED chips are distributed laterally over an area. The LED chips have light emitting surfaces for emitting light in directions transverse to said area, wherein the dimensions of the area do not exceed 25 mm, or perhaps somewhat larger (i.e., 25-50 mm) in the case of LED arrays with a very high number of LED chips. For example, the total diameter of the cluster of LED chips may be on the order of 8-25 mm, depending on the number of LED chips in the array, and the size of the LED chips. The spacing between individual adjacent LED chips is less than about 0.5 mm, such as on the order of a tenth of a millimeter, or a few tenths of a millimeter, and not multiple inches, as is the case with prior art LED terrarium lights.

The array can be configured as multiple strings of LEDs, with each string containing multiple LED chips. Each string can be controlled separately, allowing for dynamic control of the brightness of each string, over time. Because each string contains multiple LED chips, the spectral content of each string of LEDs can be customized in terms of its spectral content. Because each string can be separately controlled, it is possible to vary the overall spectral content of the combined light output, over time. For example, in some embodiments, some LED strings could be made up of various wavelengths of blue LED chips with one or multiple fluorescent phosphors, to provide white light of different color temperatures. It is also possible to incorporate LEDs of other colors and wavelengths, including red and green, as well as LED chips that emit UV light, or infrared wavelengths. By controlling the brightness of the separate LED strings, the relative mix of white, red, green, and other wavelengths can be varied. Within a given range of white light LEDs, using blue LED chips with fluorescent phosphors, instead of using a single type or wavelength of LED and a single phosphor formulation, it is possible to use several wavelength bands of blue LED chips, and also several different phosphor formulations with different emission spectra, thereby providing a fuller overall spectrum, with excellent color rendering, as measured by the light's Color Rendering Index (CRI). The incorporation of white LEDs with different emission spectra into separate LED strings also enables the tuning and adjustment of the color temperature of the white light provided by the LED array.

The small form factor of the LED array, and the close spacing of its LED strings and chips, results in a high intensity light from a small area. As such, the LED array behaves as an extended point source of light. In prior art terrarium lights that use LEDs, in which widely-spaced LEDs are each emitting a single, narrow-spaced range of wavelengths, the light from these multiple sources must be mixed via multiple sets of lenses and other optical elements, in order to achieve an even distribution of the light from the multiple sources (which might also be of multiple wavelengths). Even when such an elaborate arrangement is used, light from these multiple sources cannot be satisfactorily mixed unless the prior art LED light sources are kept at an impractically large distance from the terrarium. With typical mounting locations for prior art terrarium lights, different locations within the terrarium will experience differing spectral content.

In contrast, for the embodiments disclosed here the LED array can emit all of the wavelengths embodied in its multiple LED strings and multiple LED chips, from a single small-area array (with an effective diameter of only 8-25 mm, or 25-50 mm, or even somewhat larger, for example). The light as emitted from the LED array is therefore already well-mixed in terms of spectral content, even at very short distances from the terrarium, of less than about 1 foot. Since all of the LED chips in the LED array are covered by a single lens, with a diameter that is only slightly larger than the diameter of the LED array (e.g. a diameter of about 30 mm for a 25 mm diameter LED array), the cost and complexity of optics is greatly reduced. In other words, the optical lens has a principal plane, where dimensions of the optical lens along its principal plane are less than about 30 mm. Secondary optics, such as a reflector or secondary lens system, can be used to create a variety of light distribution patterns, dependent on both the intended area of illumination, as well as on the intended distance from the area to be illuminated. If the optics are designed to produce a fairly concentrated beam (e.g. a spot light), then the intensity of light will drop relatively slowly as a function of distance from the light source, resulting in greater penetration of light and light intensity at the bottom of the tank. In other words, the lower portions of the terrarium tank will receive almost as much light energy as the upper portions of the tank, in a manner that is more consistent with natural sunlight. In applications where even greater light intensity is required, it is possible to use larger LED arrays containing a large number of LED chips.

The extended point source nature also creates a desirable "shadowing" effect in the terrarium. This is similar to the shadows created by natural sunlight, as the sun behaves approximately as a point source. Incandescent bulbs can also create this shadowing effect, if the bulb filament is sufficiently small. However, fluorescent bulbs and prior art terrarium lights that use LEDs typically do not produce this shadowing effect, because of their more distributed light pattern, which does not approximate a point source of light.

Thermal management is an important element of the design, in order to extract the heat that is generated by the large number of LED chips that are packaged closely together in the LED array(s). The LED array incorporates a metal circuit board, or metal core board, (MCB) which provides for the routing of conductive traces to each of the LED strings, while at the same time providing electrical isolation between LED strings. The MCB also provides for high thermal conductivity, to extract heat from the densely-packed LED chips and has a surface selectively anodized into a pattern of electrically insulated and electrically conducting areas. The MCB LED array substrate, having the thermal conductivity of metal, conducts the heat from the LEDs to the base of the MCB substrate, which is mounted onto a heat sink. Examples of embodiments of MCBs that can used with the embodiments described here are described in more detail in U.S. application Ser. No. 12/145,395, filed on Jun. 24, 2008, entitled "A LIGHT EMITTING DIODE SUBMOUNT WITH HIGH THERMAL CONDUCTIVITY FOR HIGH POWER OPERATION", and U.S. Pat. No. 9,478,587, filed on Dec. 22, 2015, entitled "MULTI-LAYER CIRCUIT BOARD FOR MOUNTING MULTI-COLORED LED CHIPS INTO A UNIFORM LIGHT EMITTER".

In some embodiments, a heat sink can be utilized, typically finned, that efficiently transfers heat from the base of the LED array's MCB substrate. The heat sink may in some embodiments contain an internal "vapor chamber" in which phase change of a contained liquid (into vapor) is used to maximize heat transfer. The vapor chamber element transfers heat very efficiently to a more traditional finned heat sink.

In some embodiments, the heat sink dissipates thermal energy via natural convection, aided by venting of the LED terrarium light's housing. In other embodiments, the dissipation of thermal energy from the heat sink is aided by a small electric fan, mounted within the LED terrarium light's housing.

In order to allow for effective use in a variety of terrarium environments, the LED terrarium light may be mounted in a variety of ways. In one embodiment, the LED terrarium light, or multiple LED terrarium lights, are mounted by one or more gooseneck clamps to a top edge of the terrarium tank. The flexible gooseneck mounts allow the LED terrarium light(s) to be positioned at different locations above the terrarium, without blocking or covering the top surface of the tank. Multiple LED terrarium lights can be mounted to a single large terrarium tank, with each light illuminating a portion of the tank, with only minimal reduction of the desirable shadowing effect.

A variety of additional mounting options are also possible, all of which take advantage of the compact size of the terrarium light. These include simply hanging the terrarium light by its power cord, over the top of the terrarium tank, the mounting of one or more terrarium lights onto a bar that in turn mounts across the top of the terrarium tank, a flexible stand mount that positions the terrarium light next to the terrarium tank, and a suction cup mount that attaches the terrarium light to the glass wall or side of the terrarium tank.

In some terrarium lighting applications, it will be desirable to use multiple LED terrarium lights, configured to provide different wavelengths of light, or different overall spectral content. For example, it might be desirable to use one or more LED terrarium lights to replicate natural sunlight, with a separate LED terrarium light intended to replicate moonlight. The two different types of LED terrarium lights could then be operated at different times, or on different timers, to replicate the night/day cycle, or even the monthly lunar cycle. It is also possible to implement a variety of spectral contents into a single LED terrarium light, such that the spectral content of that single light can be varied over time.

Figure 2A:
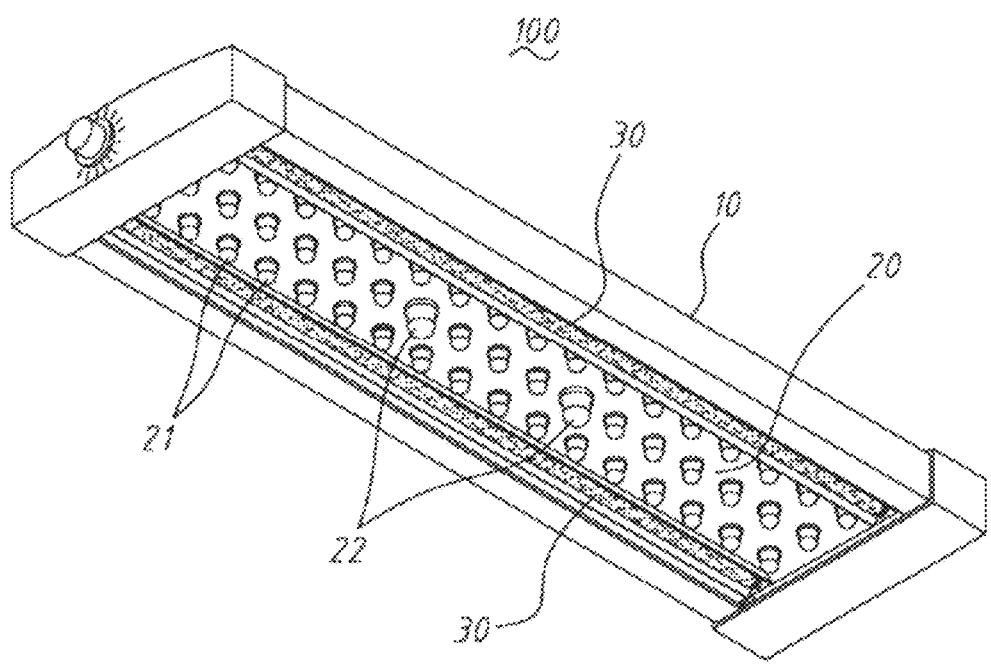
FIGS. 2A and 2B show detailed views of the prior art light source of FIG. 1.
Figure 2B:
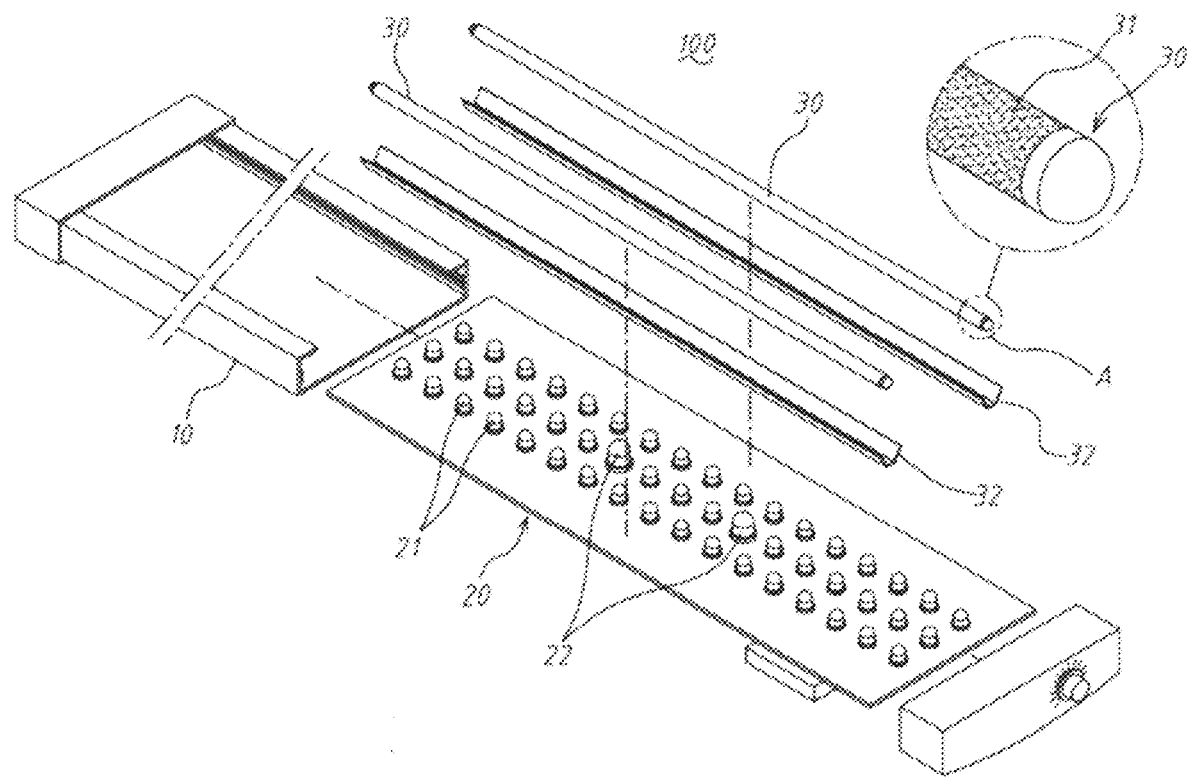

FIGS. 1, 2A, and 2B represent one example of prior art in terrarium lights. Most prior art terrarium lights that use LEDs, also use either fluorescent bulbs or tubes, or incandescent bulbs, or, in some cases, a combination of fluorescent and incandescent bulbs, to provide spectral components that are not being provided by the LEDs. FIG. 1, excerpted from U.S. Pat. No. 8,444,304, shows a representative terrarium light that uses both fluorescent tubes (in this case, phosphor-coated cold cathode tubes) and a panel of multiple LEDs in separate packaging (22), mounted to a light hood (100) that covers the top of the terrarium. In this prior art example, the LEDs are providing visible light, and the phosphor-coated cold cathode tubes are providing UV light.

The underside of the light hood (100) is shown in FIG. 2A, and in an exploded view in FIG. 2B, both also excerpted from U.S. Pat. No. 8,444,304. The light includes two phosphor-coated cold cathode tubes (30), each provided with its own reflector element (32), to provide UV light. The multiple individual LEDs (21) are providing white light. Two additional LEDs (22) are used to provide red light, which is stated to be for night use. The form factor of this prior art example results in a highly-distribute light, with poor, unnatural shadowing. Although this example provides UV light, and also separate visible light sources for daytime and nighttime use, it does not provide infrared light, to provide heat.

Figure 3:
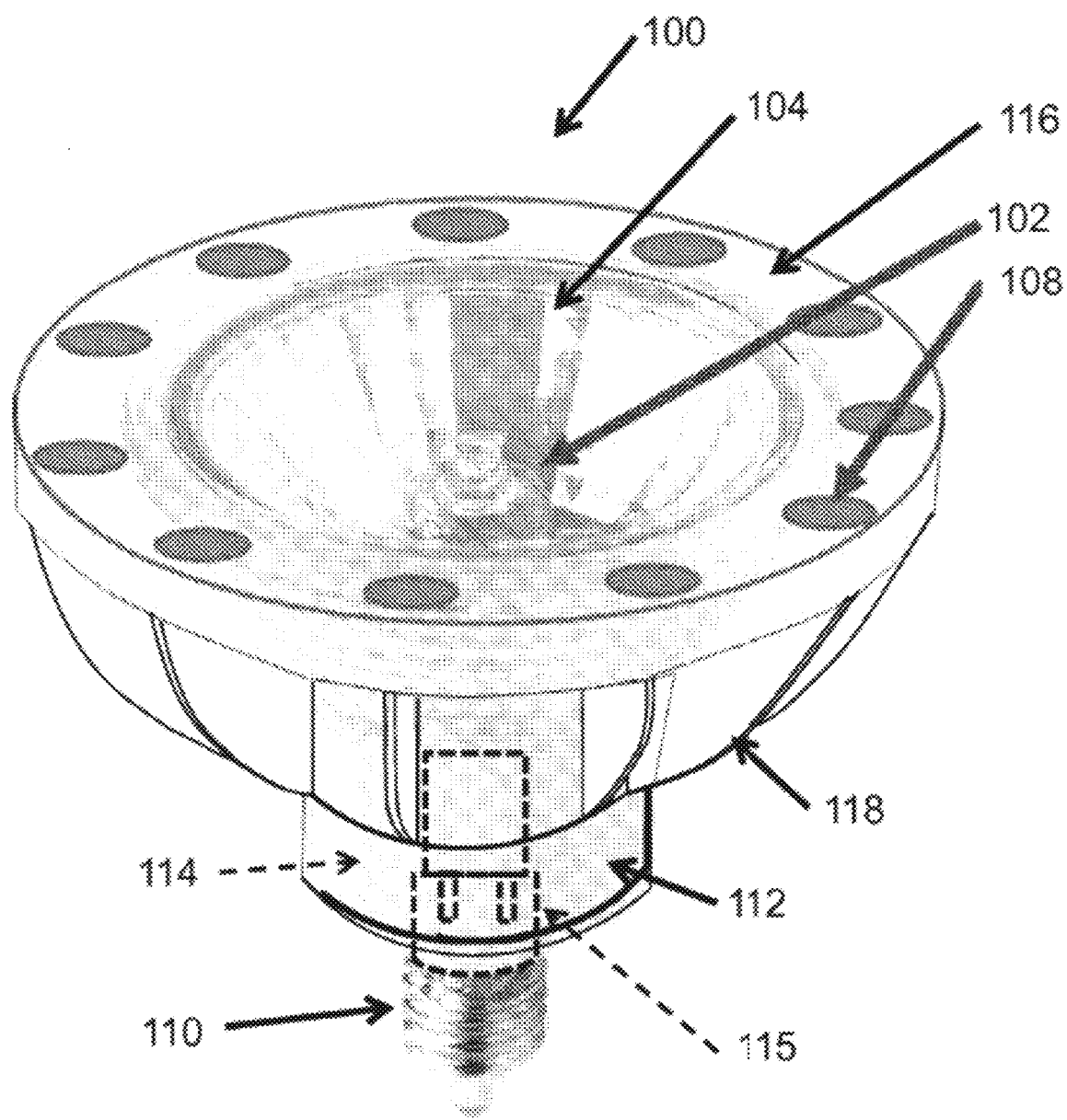
FIG. 3 shows another reptile lamp of the prior art, combining UV LEDs with an MR 16 halogen incandescent reflector lamp.

FIG. 3 shows another example of prior art in terrarium lights that use LEDs, and is excerpted from International Patent (WIPO/PCT) Publication Number WO 2015/077734. This prior art example can be viewed as the conceptual "opposite" of the prior art example shown in FIGS. 1, 2A, and 2B. In the prior art example of FIG. 3, a ring of UV-emitting LEDs (108) is located around the perimeter of an MR16 form-factor halogen incandescent reflector lamp. A halogen incandescent bulb (102) is providing visible light, as well as infrared wavelengths, and is surrounded by a reflector (104). UV light is provided by the LEDs (108).

FIGS. 1, 2A, 2B, and 3 show two examples of the prior art in terrarium lights that use LEDs. However, in both cases, the LEDs are only providing a portion of the overall light being provided. In the example shown in FIGS. 1, 2A and 2B, multiple individually-packaged, and widely-spaced (multiple inches apart) LEDs are providing visible light, while UV light is provided by phosphor-coated cold cathode tubes. In the example shown in FIG. 3, visible light and infrared wavelengths are being provided by a halogen incandescent bulb, and the LEDs are only being used to provide UV light. Both of these examples of the prior art in terrarium lights that use LEDs provide for some degree of efficiency improvement, over traditional, non-LED terrarium lights. At the same time, they also suffer from some of the impairments and disadvantages of non-LED terrarium lights, based on their continuing use of traditional light sources for a portion of their overall light output.

Figure 4:
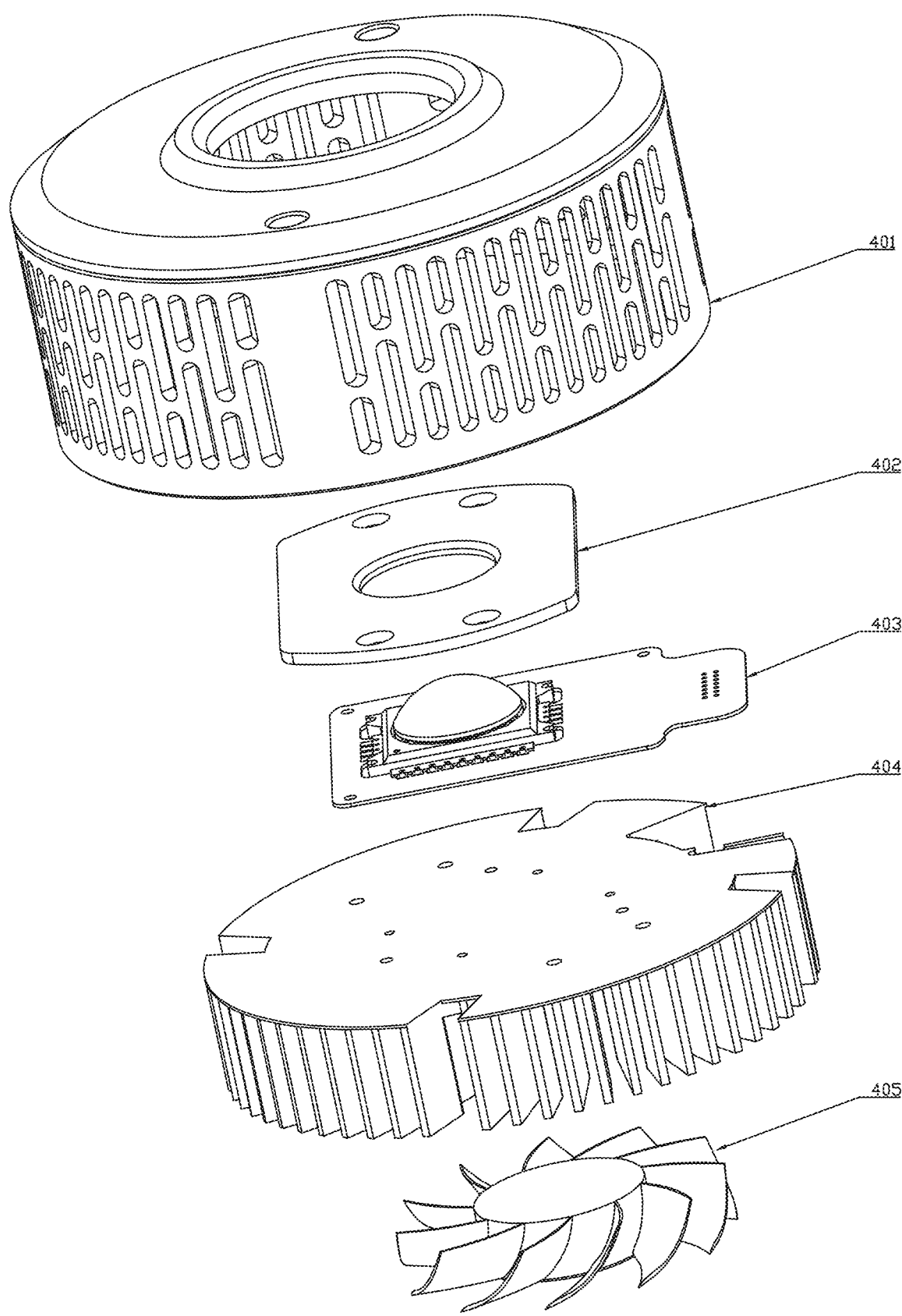
FIG. 4 is a representation of a portion of one embodiment, not including a portion of the LED terrarium light's housing, and also not including the control electronics and electrical connectors.

FIG. 4 shows one embodiment of a portion of the lighting apparatus being presented here. In this embodiment, multiple LED chips without separate individual packaging, either of a single wavelength, or of multiple wavelengths, are mounted into a single, densely-packed LED array mounted on a circuit board 403. Adjacent chips of the array are preferably separated by less than about 0.5 mm, such as 0.1 to 0.2 mm. The LED array is mounted onto a heat sink (404), which may also optionally incorporate a "vapor phase change" element, as described above. The LED chips of the LED array are distributed over an area of a substrate that is typically not more than 25 mm in dimensions in any direction, where the dimensions of the area depend on the number of LED chips in the array. In the case of LED arrays with an extremely large number of LED chips, the dimensions of the LED array may exceed 25 mm. Since the surface area of the LED array is relatively small, a single reflector (not shown) may be used for the entire array, and may be mounted on a front plate (402), or built into the front portion of the outer housing (401). The front face of the outer housing (401), shown facing up in FIG. 4, will typically be covered with a transparent piece of glass, or alternatively, plastic. This transparent cover serves to protect the optional reflector and the LED array, and also prevents contact with the reflector surface and the LED array's lens. In cases where very good light mixing is required, for improved uniformity of the light output and spectral content, an optical diffuser element may optionally be incorporated, either as a separate element just under the transparent cover, or in place of the transparent cover. The diffuser element may be made of glass or plastic.

Figure 5A:
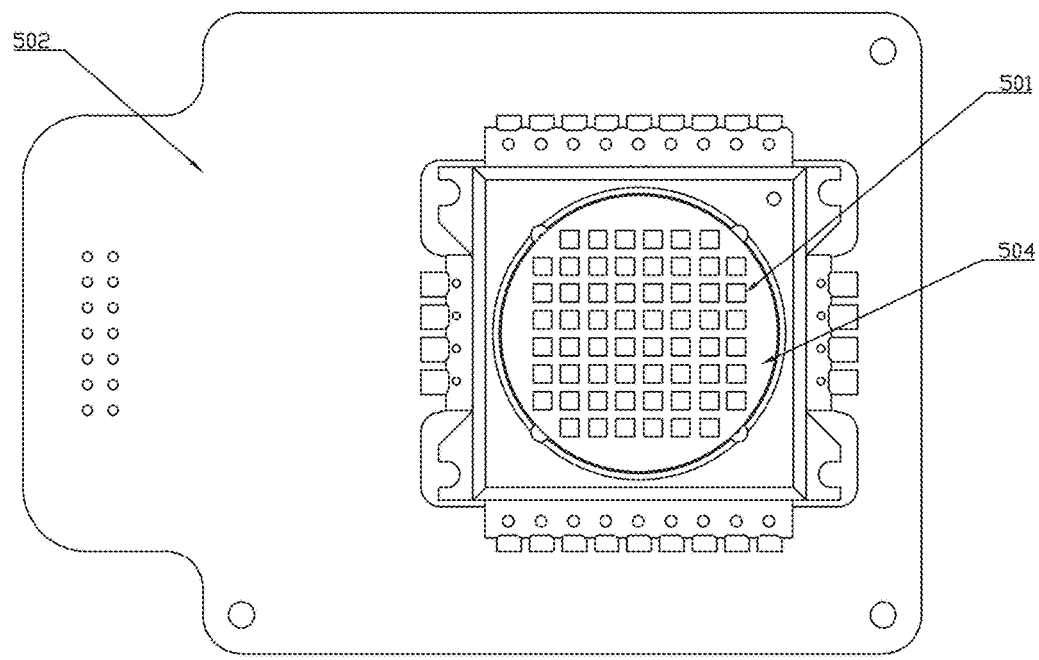
FIGS. 5A-5C show views of one embodiment of the densely-packed LED array, with 60 LED chips.
Figure 5B:
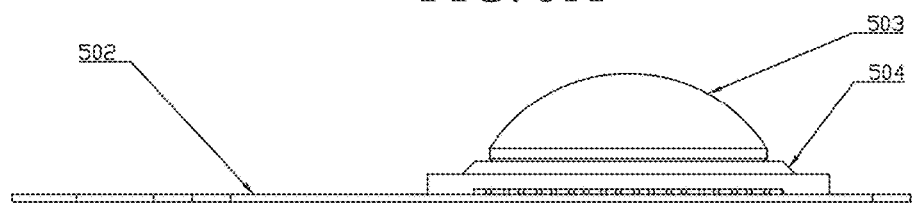

FIGS. 5A and 5B show two views of a representative embodiment of the LED array, with 60 LED chips, mounted onto a circuit board (502). Other embodiments of the LED array may contain fewer than 60 chips, or as many as 100 LED chips, or even more. The individual LED chips of the embodiment shown in FIGS. 5A and 5B are approximately 1 mm×1 mm in size. However, LED chips of other dimensions may also be used, and the diameter of the light-emitting area is therefore a function both of the number of LED chips, as well as the individual chip dimensions. In FIGS. 5A and 5B, the LED chips are shown as element 501, with each small square representing an individual LED chip. The LED chips are mounted on a substrate (504). The diameter of the light-emitting area of the array is approximately 15-20 mm for the 60-chip LED array, thereby allowing the LED array to function as an "extended point source". LED arrays with a larger number of chips (up to 100 chips, or even more), or LED arrays that use larger LED chips, may have a somewhat larger light-emitting area, with diameters up to approximately 25 mm, or even more. Note that the single lens (503) that is placed over the light-emitting area of the LED array may have a diameter that is slightly larger than the actual light-emitting area, such as a diameter of approximately 30 mm, as an example.

The LED chips within each array are connected electrically into multiple channels, for example four channels, or potentially more or fewer than four channels, each channel consisting of a series string of multiple LED chips. An LED string or channel is controlled as a single entity, with all LED chips within the series string having an identical electrical current passing through them, and therefore each chip within a string will produce light of similar brightness. Separate electrical connections are provided for each LED string within the array, either in the form of electrical pins, or as electrical pads, so that the relative brightness of the different strings can be controlled and varied independently. The LED array shown in FIGS. 5A and 5B may also incorporate an internally-mounted thermistor chip, which is brought out to two of the electrical connections, for the purpose of monitoring array temperature.

Figure 5C:
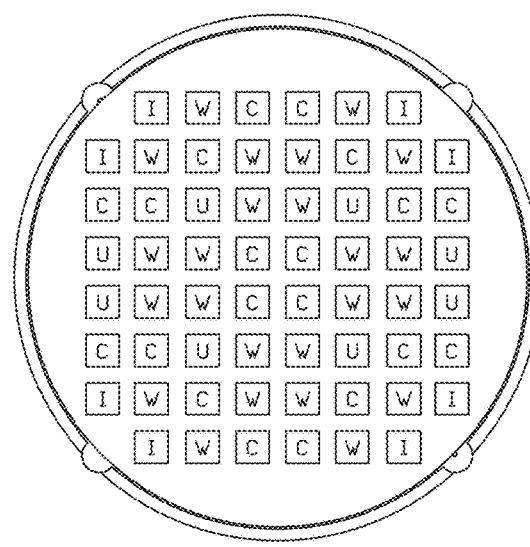

FIG. 5C looks at the LEDs mounted on the substrate 504 more closely. The individual LEDs, such as 501, are arranged as an array on the surface of the substrate 504 as, in this example, four individually drivable channels. In this example, the four sets of LEDs include a first set, or channel, of white or almost white, LEDs labelled W, providing a "warm white" light of relatively low color temperature (e.g. 2700 degrees K), a second channel of white or almost white LEDs labelled C, providing a "cool white" light of relatively high color temperature (e.g. 6500 degrees K), a channel of UV LEDs labelled U, and a channel of IR LEDs labelled I. Each of these channels has a corresponding set of electrical contacts, at which the corresponding driver circuits are connected. It should be noted that the arrangement of LED chip types, and their respective quantities, are merely for illustrative purposes. The number of types of white light or almost-white light LED strings can be greater than the two types shown in FIG. 5C. The chips shown as UV LEDs might comprise both UVA and UVB LED chips in various proportions, or just a single type of UV LED chip. The number of separately-controlled LED strings can also vary, within the limitations of the number of electrical contacts provided by the array.

In most embodiments, the LEDs within a string would be of similar wavelengths. However, different strings might contain LEDs of widely-varying wavelengths. In one embodiment of the LED array, some strings would consist of different wavelengths of blue light, coated with fluorescent phosphors of one or multiple formulations and emission spectra, thereby producing white light of different color temperatures. It is also possible to incorporate LEDs of other colors or wavelengths, such as red, yellow, and green. Similarly, it is also possible to incorporate infrared LED chips and/or UV LED chips, either as part of LED strings that produce visible light, or, more typically, in separate strings. By separately controlling the electrical current flowing through different LED strings, the relative proportions of the spectral content of each LED string can be varied. Within a particular string, it is still possible to use individual LED chips of multiple wavelengths, although the brightness of the LED chips within a string will be essentially the same. In one embodiment, multiple wavelength ranges of blue light (e.g. ~425 nm, ~450 nm, and ~470 nm) could be used in a string, in order to achieve broader coverage of the blue portion of the spectrum. Similarly, multiple formulations of fluorescent phosphors could be used within a string, or in multiple strings, in order to provide broader-spectrum white light, with a variety of color temperatures, as well as the ability to tune or adjust the color temperature of the white light. Infrared LED chips, with wavelengths longer than 700 nm, can be used to provide a heating or warming effect, which is beneficial to many species of reptiles. UV LED chips can also be included, for their health benefits, as described earlier. LED chips that emit in the UVA region (315-400 nm) are readily available. LED chips that emit in the UVB region (280-315 nm) are also available, but are more expensive, and relatively less efficient. However, for reptile (and bird) health, it may be beneficial to include both UVA and UVB LED chips. (Conversely, UVB LED chips would potentially be harmful to amphibians.)

Figure 6:
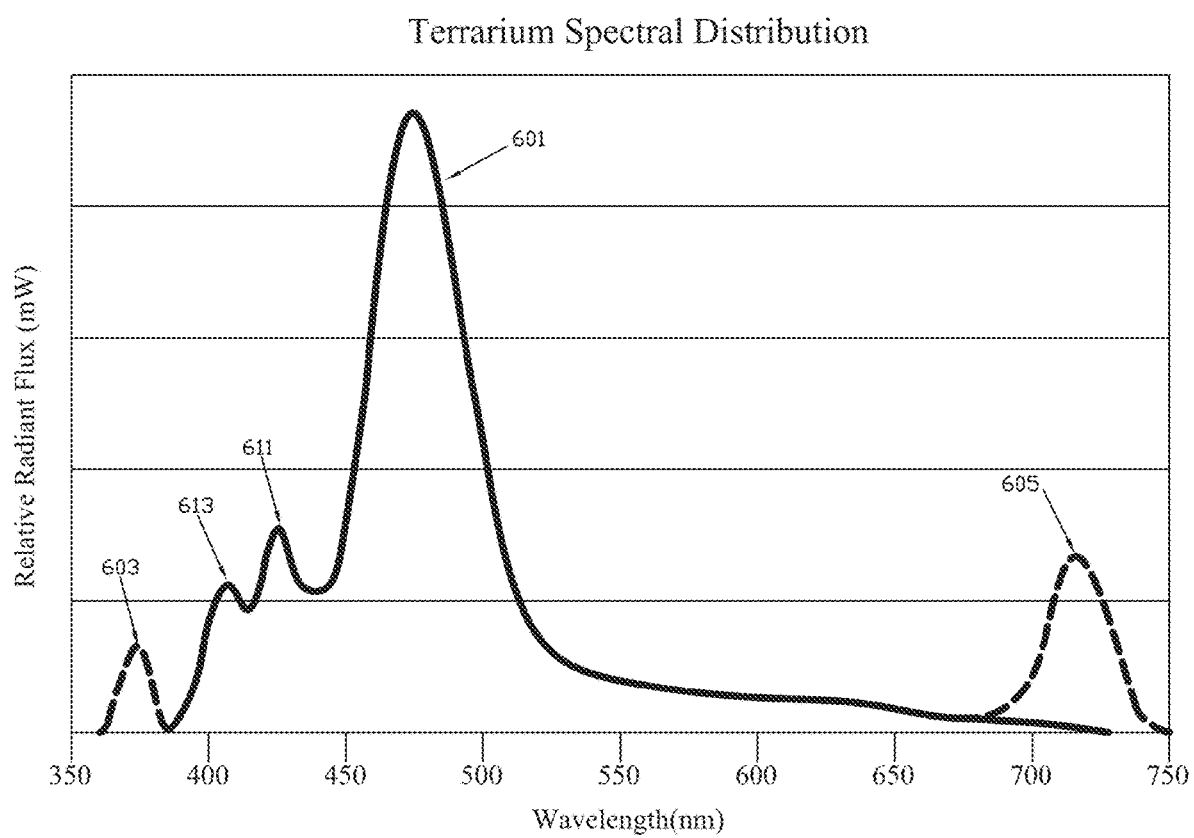
FIG. 6 shows the spectral output of one embodiment of the densely-packed LED array, using LEDs of multiple wavelengths, and fluorescent phosphors.

FIG. 6 shows a representative spectral distribution of light for one such embodiment of the LED array, in which multiple wavelengths ranges of blue LEDs, coated with fluorescent phosphors, are contributing broad spectrum white or almost white light, as illustrated by the portion of the distribution labelled 601, with wavelengths in the visible light range of 400-700 nm. The spectral distribution also includes an upper ultraviolet (UVA) wavelength (~375 nm) contribution 603, as well as infrared emission contribution, above 700 nm, labelled 605. As described below, the amplitude of these different components to the combined spectral distribution can be independently controlled to vary resultant combined distribution. The peak wavelengths of the blue LEDs contribution to the white distribution 601 are shown at the peaks 611 and 613 in FIG. 6, as well as the higher intensity and broader spectral "plateau" around 500 nm that is provided by the use of fluorescent phosphors. As used here, white light can be defined as light with color coordinates that lie along, or very close to, the black-body radiation curve. The position of the color coordinates along the black-body radiation curve determine the Coordinated Color Temperature (CCT) of the light, where the color coordinates referred to here can be defined according to the CIE 1931 color space, as defined by the International Committee on Illumination, in 1931. "Almost white light" refers to light that has color coordinates that lie somewhat above or below the black-body radiation curve. Such an almost white light would tend to have a visual appearance that was akin to a pastel color, or white light with a trace of color (e.g., pale pink, or pale blue). In many embodiments, almost white light strings would not be used "by themselves", but rather would be combined in different proportions, in order for the combined light output of the multiple strings to be actual white light, with color coordinates lying on, or very close to, the black-body radiation curve, with tunable CCT (color temperature). For example, by having, say, four strings of almost white light, with color coordinates that lie above and below the black-body radiation curve at two color temperatures (above and below the 2500 degrees K point, and above and below the 6700 degrees K point), then by combining these four strings in different proportions, you can get a combined light output that is white light, lying along the black-body radiation curve, with a tunable color temperature range of 2700 degrees K to 6500 degrees K. This white light source could therefore replicate the warm white light output of an incandescent bulb (or sunlight when the sun is low on the horizon), to broad daylight at noon. The peak wavelengths of the UVA LEDs can be seen in the peak of 603 at about 375 nm, where alternately or additionally a string of independently controllable UVB LEDs can be included. The peak of 605, with wavelength above 700 nm, is provided by one or multiple infrared LED chips. In this example, the peak output of the IR LEDs shown at 605 is about 725 nm, where a more general definition would be wavelengths above 700 nm, where the IR extends to well above this, up to 5,000 nm. IR LEDs are generally viewed as emitting short wavelength IR, in the approximate range of 700 to 1,000 nm (the portion of the IR range that is just above the red portion of visible light). For LED "heat lamps", the most common wavelength used is 850 nm. 940 nm IR LEDs are also a typical value, but most often are used for "night vision" applications. If ongoing research indicates the value of other specific wavelengths, such as red, yellow, or green visible light, for encouraging specific terrarium life growth or other attributes, it is possible to incorporate one or more LED chips of those additional wavelengths into the array.

Since the LEDs of the array are contained within a small area (with a diameter of approximately 15-20 mm in FIGS. 5A and 5B), with a single (optional) reflector, the mixed spectral content of the LED terrarium light will be directed uniformly over the surface of the terrarium tank, at a typical distance of less than a foot or two. As such, the mixed light output of the entire array can be viewed as coming from an "extended point source", of a small area. Note that the dimensions shown in FIGS. 5A and 5B are approximate and may vary with the number of LED chips in the array, the size of the individual LED chips, the specific configuration of LED channels within the array, and also the type of lens used.

Due to the relatively small light-emitting surface area of the LED array, a single lens can be used as the primary optic. Since LED chips emit light in an upwards direction (with the LED array oriented as in the side view of FIG. 5B), a simple lens element can be mounted on the surface of the LED array. In the embodiment of the LED array shown in FIG. 5B, a commercially-available half-ball lens (HBL) can be used for the lens 503. In another embodiment of the LED array, a Truncated Ball Lens (TBL) is used, which can be visualized as a half-ball lens in which the base has been ground down to make a "flatter" lens of similar diameter. Either type of lens may be used with LED arrays of different LED chip count, although the diameter of the lens depends on the number of LED chips in the array. The truncated ball lens (TBL) produces a somewhat broader, flatter light distribution pattern, compared to the half-ball lens (HBL).

Figure 7:
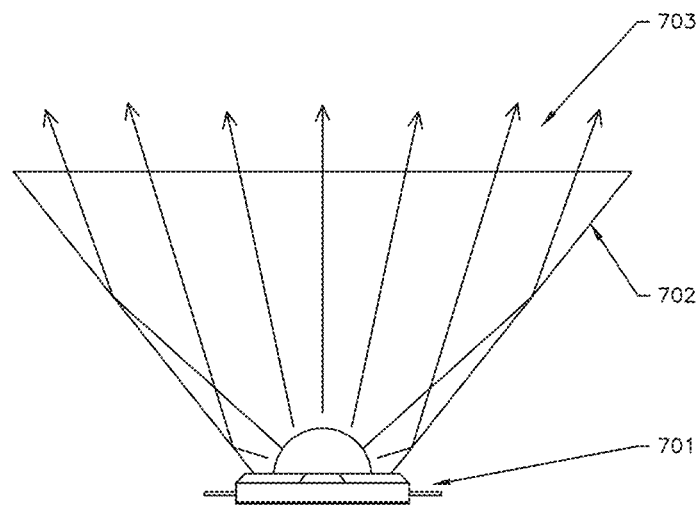
FIG. 7 shows a side view of the 60-chip LED array, using one embodiment of a reflector, providing a wide beam pattern.
Figure 8:
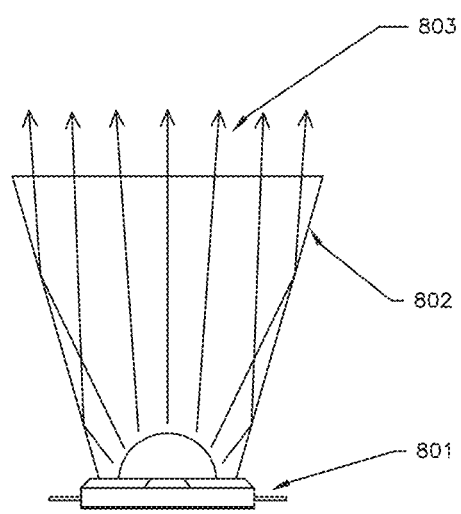
FIG. 8 shows a side view of the 60-chip LED array, using another embodiment of a reflector, providing a narrow beam pattern.

In order to provide for a variety of beam patterns, the lighting apparatus may incorporate an optional reflector element as a secondary optic. As with the lens element, the small size of the LED array allows a single reflector element to be used, to shape the light output of many LED chips. The shape of the reflector element may be varied to create a variety of beam patterns, with a variety of beam angles. FIGS. 7 and 8 show side views of the 60-chip LED array (701 and 801), with two embodiments of optional reflectors. In FIG. 7, the reflector (702) is shaped to provide a wider beam angle, as illustrated by the representative light rays (703). In FIG. 8, the reflector (802) is shaped to provide a narrow beam angle, as illustrated by the representative light rays (803). Wide beam angles (such as in a typical "flood light") will allow a single LED grow light to illuminate a relatively large area, although the intensity of the light output will diminish more rapidly as the distance from the light source increases. Alternatively, a narrow beam angle (such as in a typical "spot light") will illuminate a relatively smaller area, but the intensity of the light output will diminish more slowly as the distance from the light source increases. A narrow beam angle will therefore result in more uniform illumination between the upper and lower portions of the terrarium and will penetrate more effectively to the bottom of the terrarium, especially in deeper tanks.

Due to the large number of LED chips in the LED array, significant amounts of heat are generated. As discussed above, the LED array incorporates a metal circuit board (MCB) as its substrate, which has a high thermal conductivity and very low electrical conductivity (i.e. it is highly electrically insulative). This MCB is a supporting structure shown in FIGS. 5A and 5B, without detail. The array of LED chips is bonded to this supporting structure. The MCB substrate provides excellent thermal conductivity from its top surface to its bottom surface, while having a surface selectively anodized into a pattern of electrically insulated and electrically conducting areas that maintains a high degree of electrical isolation (i.e. low electrical conductivity, or high insulation). Embodiments of the MCB are described in more detail, including its internal structure, in U.S. patent application Ser. No. 12/145,395, filed on Jun. 24, 2008, entitled "A LIGHT EMITTING DIODE SUBMOUNT WITH HIGH THERMAL CONDUCTIVITY FOR HIGH POWER OPERATION", and U.S. Pat. No. 9,478,587, filed on Dec. 22, 2015, entitled "MULTI-LAYER CIRCUIT BOARD FOR MOUNTING MULTI-COLORED LED CHIPS INTO A UNIFORM LIGHT EMITTER". The MCB of the LED array serves to carry the heat of the LEDs to the base of the array, and from there to the underlying heat sink.

In the embodiment of FIG. 4, a representative, finned heat sink 404 is used. In other embodiments it is possible to combine the traditional finned heat sink with a "vapor chamber" or "vapor phase change" element, creating a two-stage heat sink assembly. In one such embodiment, the vapor chamber is a commercially-available part, such as the Vapor Chamber thermal device from the Microloops Corporation. Similar products, such as the Celsia NanoSpreader vapor cooler from Intel Corporation, may be used in other embodiments. In both cases, the phase change of a liquid that is contained within the vapor chamber element (into vapor) is used to achieve high thermal conductivity and transfer of heat from the top surface of the vapor chamber, to its bottom surface. The vapor chamber element also serves to spread the heat from the bottom of the LED array, to the much larger area of the bottom surface of the vapor chamber element. This maximizes the thermal effectiveness of the finned heat sink, and allows the use of a larger finned heat sink, with top surface area that is significantly larger than the bottom surface of the LED array. In some embodiments, heat dissipation from the finned heat sink 404 is aided by use of a small electric fan (partially shown as element 405).

Figure 9A:
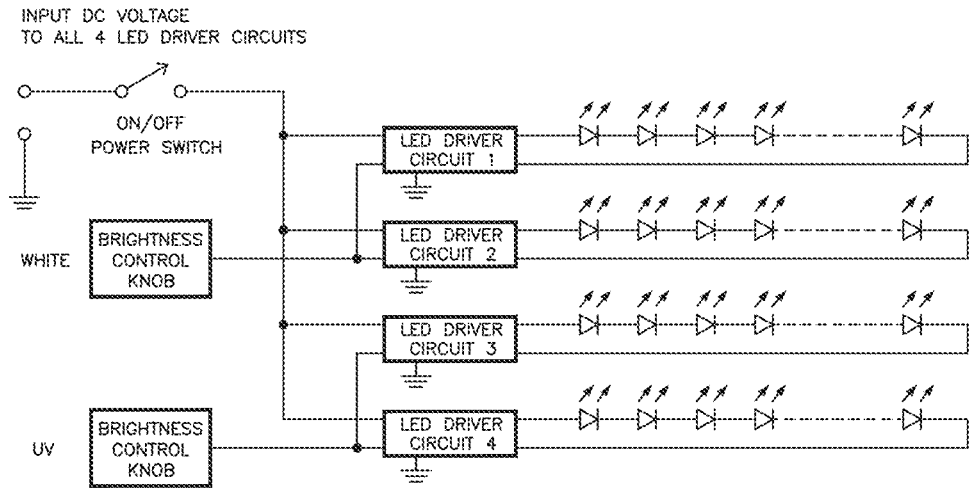
FIG. 9A shows a block diagram of representative control electronics for one embodiment.

It is common practice to power or drive strings of LED chips using driver circuits that convert a DC voltage to a "constant" DC current. In one embodiment, an electronic printed circuit board is used, containing four LED driver circuits. FIG. 9A shows a functional block diagram of one embodiment of this electronic control circuit. Each LED driver circuit converts an input DC voltage to a constant DC current, which is fed to one of the LED strings of the LED array. In one embodiment, the current level for each string is fixed, and is set to a predetermined level of DC current. In other embodiments, one or more control knobs can be used to vary the DC current that is fed to each LED string. A single control knob may be used to vary the DC current to all four LED strings in unison, thereby serving as a simple dimming or brightness control.

In other embodiments, multiple knobs may be used to independently vary the DC current of individual LED strings, thereby controlling both the overall brightness of the LED grow light, as well as its spectral content. In one such embodiment, such as is shown in FIG. 9A, one brightness control knob is used to vary the brightness of one or more LED strings of white or almost white light providing white light of one specific color temperature, while a second brightness control knob provides independent control of the brightness of one or more LED strings providing UV light. Additional drivers, control knobs, and LED strings can be included for providing IR light, UV light of a different UV ranges, or white or almost white light of a second specific color temperature. By varying the settings of the two control knobs of white or almost white light of different specific color temperatures, the relative mix of the two separate color temperatures can be varied, to create different color temperatures of white light. For example, different settings of the two knobs could be used to simulate daylight conditions and moonlight conditions, where a control circuit can vary one or both of the intensity or spectral content of light to be emitted according to a continuous range of values. A simple on/off switch is used to turn on or turn off the LED drive circuits. A standard power connector is used to bring in DC voltage from a commercially-available DC power supply. In one embodiment, the input power is intended to be 24 Vdc. The current requirement of the power supply is dependent on the number and type of LED chips used in the LED array. In one embodiment, using a 60-chip LED array, the recommended power supply would provide approximately 4 amps, at 24 Vdc. The LED driver circuits may be designed to accept, and work with, a relatively broad range of DC input voltages, such as 12-30 Vdc, or even higher DC voltages, in order to work with a wide range of AC-to-DC power supplies. Embodiments with more, or fewer LED driver circuits, and more or fewer control knobs, are all within the scope of the present disclosure.

Figure 9B:
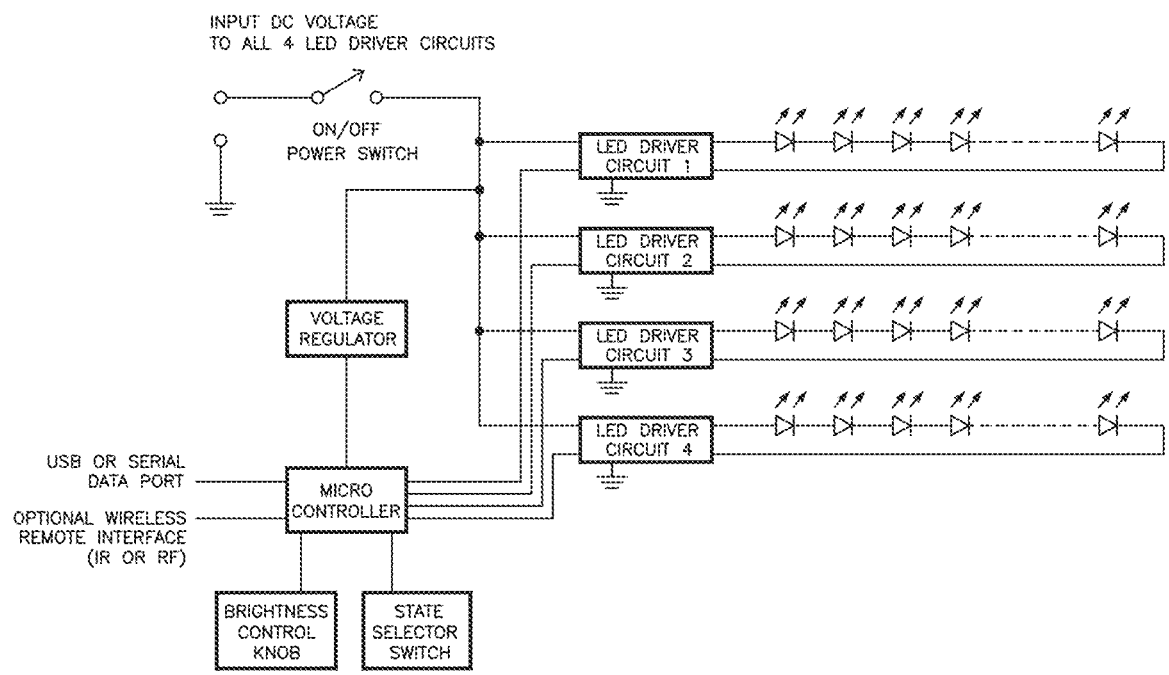
FIG. 9B shows a block diagram of representative control electronics for another embodiment, using a micro-controller for additional control flexibility.

FIG. 9B shows a block diagram of another embodiment of the electronic control circuit. In this embodiment, a micro-controller is used, to allow more sophisticated control of the light output from the multiple LED strings or channels of the LED array. In this embodiment, multiple states of light output can be pre-defined in the micro-controller's embedded software and internal memory, with different LED currents defined for each LED string or channel. This results in a different color mix or spectral content for each state. A selector switch is used to select one of the pre-defined, stored states. A brightness control knob is used to control the overall brightness of the pre-defined "color". Using an LED array with different wavelengths of LED chips in the different LED strings or channels, it would be possible to pre-define light output states that were optimized for specific desired terrarium viewing conditions, or for specific effects related to terrarium life growth and health, including reptiles, birds, and plants. The micro-controller could also be programmed to smoothly transition between pre-defined light output states, over a period of time.

The control circuit shown in FIG. 9B includes an optional USB interface or other serial data port, which could be used for directly controlling the LED terrarium light. This port could also be used for downloading new firmware or embedded software to the micro-controller, including the downloading of new pre-defined light output states. The interface could also be used for uploading data collected by the micro-controller, such as a record of the light settings over a period of time. An optional wireless remote interface is also shown, using either an infrared (IR) or radio frequency (RF) remote control. Commonly used wireless interfaces such as Wi-Fi or Bluetooth may also be implemented. This feature would allow a user of the LED terrarium light to select light output states (including turning the LED terrarium light ON or OFF) from a modest distance away from the LED terrarium light. In the case of a Wi-Fi or Bluetooth-enabled LED terrarium light, a computer or smartphone application may be used to control the light remotely, over an internet connection. These features will be useful in situations where the LED terrarium light is not easily accessible or reachable for manual control.

If the micro-controller or the overall control circuit of FIG. 9B is equipped with a real-time clock, or if the LED terrarium light is controllable from a computer or smartphone application, then it is also possible to program different spectral content for different times of the day, or even to vary the spectral content by date, season, or lunar cycle. One purpose for this feature would be to better replicate the time-varying spectral content of natural sunlight and natural moonlight. The programming capability could also be used for periodically turning on UV LEDs and/or infrared LEDs, for promoting the health of terrarium life. The programming capability could also be used for potential manipulation of the terrarium life growing process, and for artificial stimulation or triggering of various effects in terrarium life growth.

Figure 10:
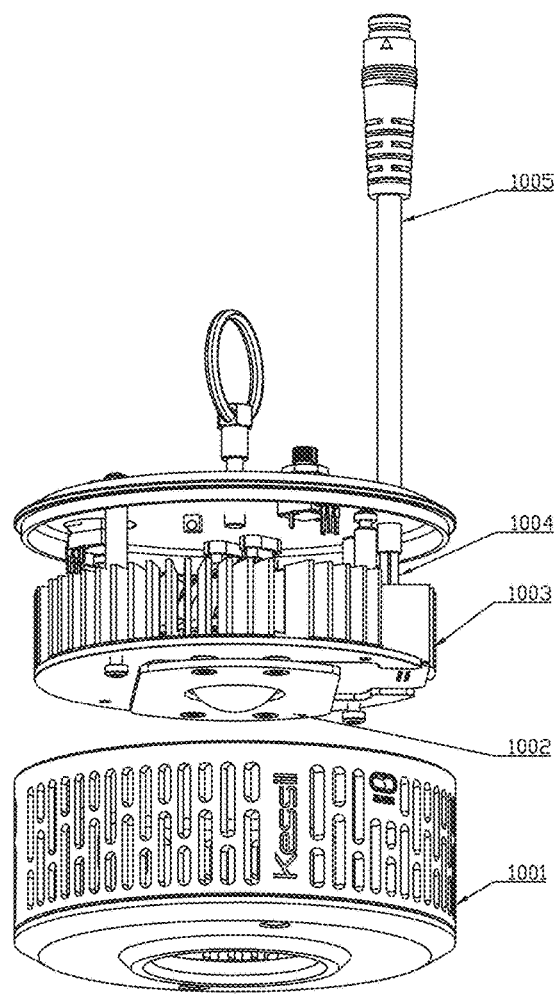
FIG. 10 shows the major sub-assemblies of one embodiment.
Figure 11:
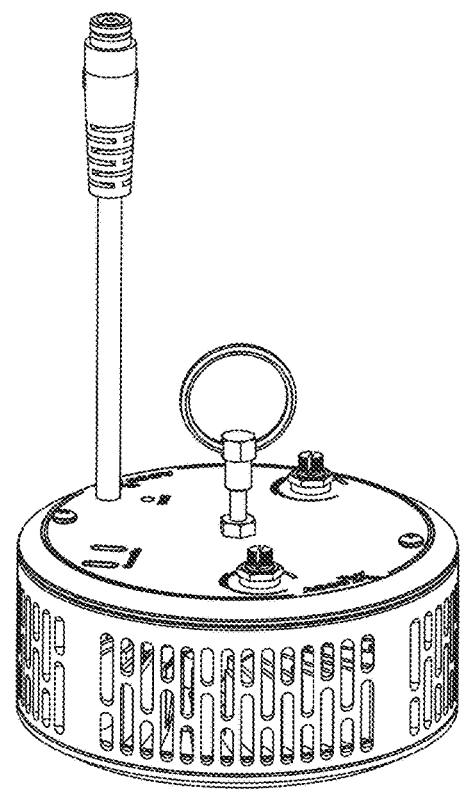
FIG. 11 shows one embodiment in fully-assembled form.

In one embodiment, as shown in FIG. 10 with the light output aimed in a downward direction, a small electric fan 1004 (the tips of the fan blades are just visible through the fins of the heat sink 1003) is mounted behind the assembly that consists of the front outer housing, with optional reflector (1001), the LED array (1002), and the heat sink (1003). Also visible in FIG. 10 are the electronic control printed circuit board, with cable connection to the LED array, and a rear housing plate that contains the DC electrical power connector (1005), optional on/off switch (not visible), and one or more optional control knobs (partially visible). FIG. 11 shows a fully-assembled embodiment, including the assembled outer housing of the LED terrarium light. As discussed above, the transparent cover plate (not shown) over the LED array and optional reflector may be a simple piece of glass or other optically transparent material, and serves to protect the surface of the optional reflector, as well as the LED array and lens that sit at the base of the optional reflector. In one embodiment, a diffusing element may be used as the cover plate, in order to provide an even higher degree of color mixing.

FIGS. 4, 10, and 11 depict an embodiment that uses a 60-chip LED array. In this embodiment, the approximate length of the LED terrarium light body is approximately two inches, with an approximate diameter of four inches, whereas many prior-art LED terrarium lights with a similar light output would have length and width dimensions in the range of one to two feet, or more. When using an LED array with a larger number of LED chips, the larger array size and larger total thermal load might require the use of a somewhat larger heat sink, fan, and mechanical housing, although in most respects the construction of such a version is very similar to the 60-chip version. The length of the higher chip-count embodiment may be longer, compared to the length of the 60-chip embodiment. In addition, the diameter of the higher chip-count embodiment of the LED terrarium light may also be somewhat larger, approximately four to six inches.

The LED terrarium light allows for a variety of mounting arrangements, in order to effectively direct the light output of one or more LED terrarium lights onto the top surface of the terrarium tank, or in some cases, to other specific locations within the terrarium tank. In many cases, an objective of the mounting arrangements is to avoid blocking of access to the top surface of the terrarium tank.

Figure 12:
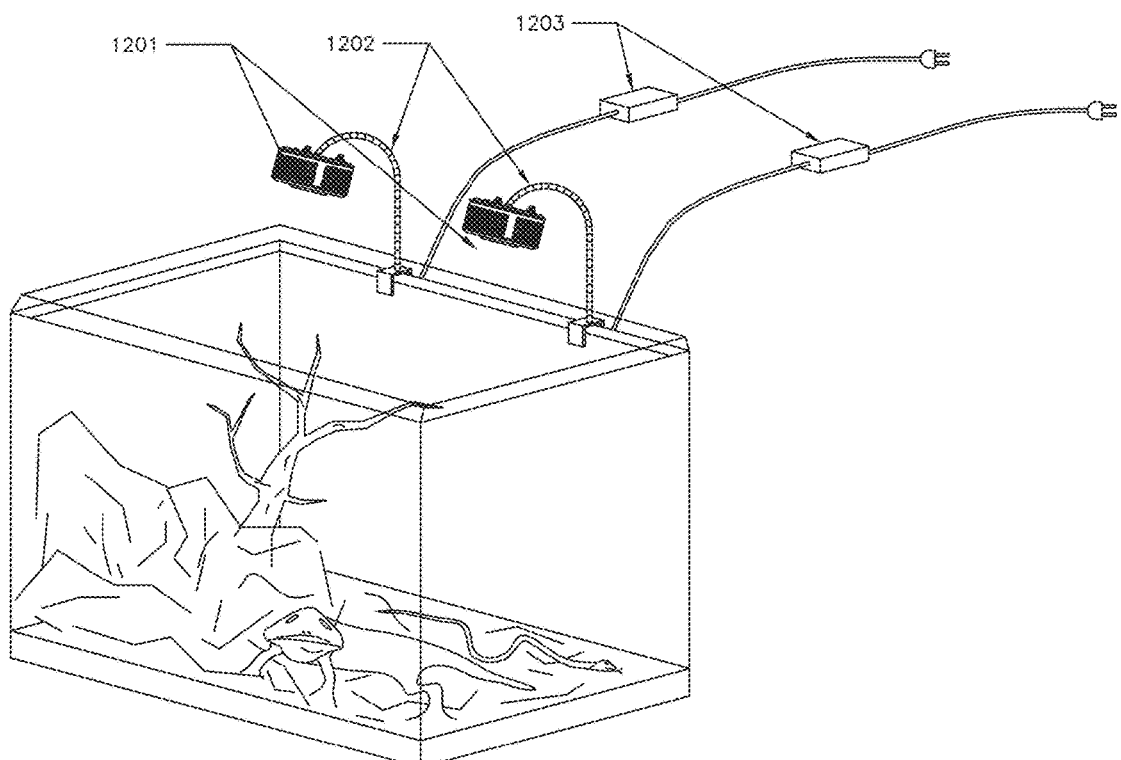
FIG. 12 shows two embodiments mounted to a terrarium using gooseneck mounts.

FIG. 12 shows two embodiments 1201, each using a single LED array, mounted to the top of the rear tank wall of the terrarium using clamp-on, flexible gooseneck mounts 1202. The flexible gooseneck mounts allow the LED terrarium lights to be positioned appropriately over the top surface of the terrarium, and allow for some adjustment of the angle of the LED terrarium lights, and of the distance between the light and the tank. This allows the LED terrarium lights' positions to be adjusted for an attractive shadowing effect, and also to ensure even coverage of the terrarium's surface area. The power supplies 1203 for the terrarium lights are kept out of the way, behind the terrarium. Due to the small size of various embodiments of the LED terrarium light, they do not block viewing of the terrarium from the top, and also do not interfere with activities such as feeding, tank cleaning, and other terrarium maintenance tasks. This represents a significant advantage over the prior art terrarium lights, which effectively cover much of the top surface of the terrarium.

Figure 13:
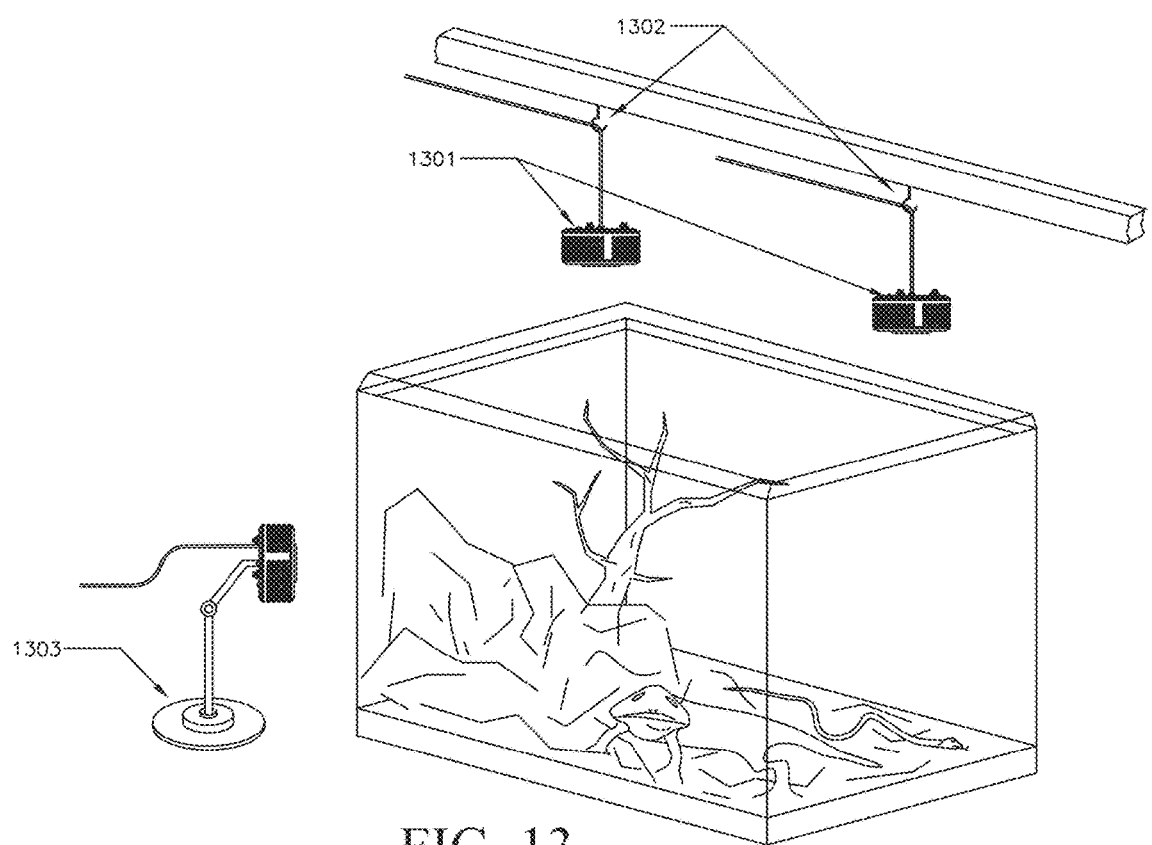
FIG. 13 shows additional embodiments, using hanging mounts and a flexible stand mount.

FIG. 13 shows additional embodiments, illustrating additional mounting options. Two terrarium lights 1301 are shown suspended by their power cords, which pass through ceiling hooks 1302. A third terrarium light is shown mounted onto a flexible stand mount 1303, which allows the light to be directed at a specific location within the terrarium tank. One purpose for this sort of stand mount would be to provide supplemental illumination of terrarium plants, to encourage their growth.

Figure 14:
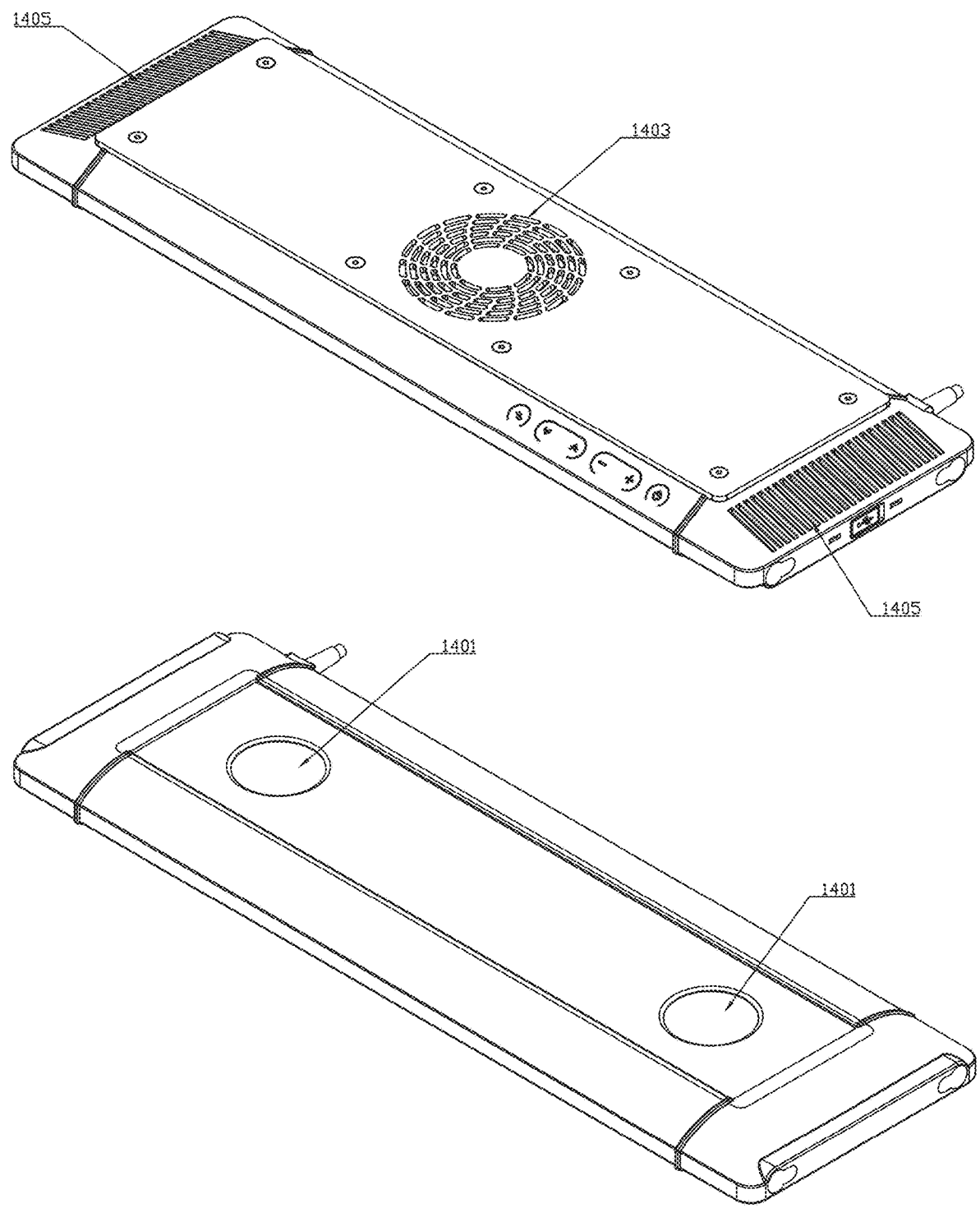
FIG. 14 shows two views of an additional embodiment, using a panel-like housing and two LED arrays.

FIG. 14 shows two views of an additional embodiment, in which two LED arrays are mounted within a single, panel-like housing. The figure shows a top perspective view, and a bottom perspective view. On the bottom side, the protective cover over the two LED arrays 1401 can be seen. The top view shows the circular vents for a single fan 1403, that draws cooling air into two sets of vents 1405 on either end of the housing, thereby creating a cooling air flow across the backs of the two LED arrays. This embodiment would partially block access to the top of the terrarium tank, but provides the combined light output of two LED arrays in a single housing.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

It is claimed:

1. A lighting apparatus, comprising:
   a substrate;
   a two dimensional array of a plurality of light emitting diode (LED) chips arranged laterally upon and each mounted, without individual packaging, on a surface of the substrate and arranged to emit light transversely to the surface of the substrate, the array including:
- one or more strings of LED chips configured to emit white light or almost white light; and
- one or more strings of ultraviolet (UV) LED chips configured to emit light with a wavelength less than 400 nm,
- wherein each of the one or more strings of LED chips configured to emit white or almost white light are drivable independently of the one or more strings of UV LED chips, and
- an optical lens adjacent to the substrate and mounted on a surface of the array, covering all of the LED chips of the array, the optical lens configured to collect and direct light emitted from the plurality of LED chips transversely to the surface of the substrate to form an extended point source.

2. The lighting apparatus of claim 1, the array further including:
- one or more strings of infrared (IR) LED chips configured to be drivable independently of the one or more strings of LED chips configured to emit white or almost white light and the one or more strings of UV LED chips.

3. The lighting apparatus of claim 1, further comprising: a plurality of independently controllable drivers, including one or more drivers for the one or more strings of LED chips configured to emit white or almost white light and one or more drivers for the one or more strings of UV LED chips.

4. The lighting apparatus of claim 3, further comprising: a printed circuit board on which the plurality of drivers are located and by which the drivers are electrically connected to the corresponding string or strings of the one or more strings of LED chips configured to emit white or almost white light and the one or more strings of UV LED chips.

5. The lighting apparatus of claim 3, further comprising: a controller configured to individually control the plurality of drivers according to user inputs.

6. The lighting apparatus of claim 5, wherein the controller is configured to enable light of one intensity and spectral content to be emitted according to one state of a plurality of different pre-defined user-selectable light output states.

7. The lighting apparatus of claim 6, further comprising a selector switch configured to enable a user to select a desired state from said plurality of pre-defined user-selectable light output states.

8. The lighting apparatus of claim 7, wherein said selector switch is operable by wireless interface.

9. The lighting apparatus of claim 6, further comprising a USB interface through which pre-defined user-selectable light output states are loadable into said controller.

10. The lighting apparatus of claim 6, wherein said plurality of pre-defined user-selectable light output states includes states of light output optimized for specific desired terrarium viewing conditions, or for specific effects related to terrarium life growth and health, including one or more of reptiles, birds, and plants.

11. The lighting apparatus of claim 6, further comprising a real time clock wherein said controller is programmable to select from said plurality of pre-defined user-selectable light output states based on time of day, date, lunar cycle, or growing cycles of marine life, based on time of said real time clock.

12. The lighting apparatus of claim 5, wherein the controller is configured to vary one or both of an intensity or spectral content of light to be emitted according to a continuous range of values.

13. The lighting apparatus of claim 1, wherein the substrate is fabricated from a metal.

14. The lighting apparatus of claim 13, wherein the surface of the substrate is selectively anodized into a pattern of electrically insulated and electrically conducting areas.

15. The lighting apparatus of claim 1, further comprising:
- a reflector surrounding the array and configured to reflect light emitted by the LED chips of the array to form a beam transverse to the surface of the substrate.

16. The lighting apparatus of claim 1, wherein a diameter of the array does not exceed 50 mm.

17. The lighting apparatus of claim 1, wherein a diameter of the array does not exceed 25 mm.

18. The lighting apparatus of claim 1, wherein the LED chips of a first string of the one or more strings of UV LED chips are configured to emit light in a wavelength range of 315 nm to 400 nm.

19. The lighting apparatus of claim 18, wherein the first string of UV LED chips further includes one or more UV LED chips configured to emit light in a wavelength range of 280 nm to 315 nm.

20. The lighting apparatus of claim 18, wherein the one or more strings of UV LED chips further includes a second string of UV LED chips configured to emit light in a wavelength range of 280 nm to 315 nm, wherein the first string of UV LED chips and the second string of UV LED chips are independently drivable.

21. The lighting apparatus of claim 1, wherein the LED chips of a first string of the one or more strings of LED chips configured to emit white light or almost white light includes one or more LED chips configured to emit blue light.

22. The lighting apparatus of claim 21, wherein the first string of LED chips configured to emit white light or almost white light includes one or more fluorescent phosphors.

23. The lighting apparatus of claim 21, wherein the first string of LED chips configured to emit white light or almost white light includes one or more of red, yellow, and green light LED chips.

24. The lighting apparatus of claim 1, wherein the one or more strings of LED chips configured to emit white light or almost white light includes:
- a first string of LED chips configured to emit white light or almost white light; and
- a second string of LED chips configured to emit white light or almost white light, where the first string and second string of LED chips are configured to emit white light or almost white light of different color temperatures, and are independently drivable.

25. The lighting apparatus of claim 24, wherein different color temperatures correspond to different CIE (International Committee on Illumination) color coordinates.

26. The lighting apparatus of claim 25, further including:
- a controller configured to individually drive the first string and second string of LED chips configured to emit white light or almost white light to provide a desired color temperature of white light or almost white light according to user inputs.

27. The lighting apparatus of claim 1, further comprising: a heat sink thermally coupled to the substrate.

28. The lighting apparatus of claim 27, wherein the heat sink includes a vapor chamber.

29. The lighting apparatus of claim 27, further including a fan.

30. The lighting apparatus of claim 1, further comprising a clamp-on, flexible gooseneck mount for supporting on a wall of a terrarium the substrate, the array, and the optical lens, and configured to enable light emitted from the array to illuminate the terrarium.

31. The lighting apparatus of claim 30, wherein said gooseneck mount includes clamps for clamping an upper edge of the terrarium wall so that the array is located above the terrarium.

32. The lighting apparatus of claim 1, further comprising a bar mount configured to clamp onto a terrarium tank and support the substrate, the array, and the optical lens to enable light emitted from the array to illuminate the terrarium.

33. The lighting apparatus of claim 1, further comprising a flexible stand mount for supporting the substrate, the array, and the optical lens to enable light emitted from the array to illuminate a terrarium from a lateral direction.

34. The lighting apparatus of claim 1, further comprising:
one or more additional arrays of LED chips; and
a panel-like housing configured to serve as a mount for the two dimensional array of the plurality of LED chips and the one or more additional arrays of LED chips.

35. The lighting apparatus of claim 4, wherein:
the array further includes one or more strings of infrared (IR) LED chips configured to be drivable independently of the one or more strings of LED chips configured to emit white or almost white light and the one or more strings of UV LED chips, and
the plurality of independently controllable drivers further includes one or more drivers for the one or more strings of IR LED chips.

\* \* \* \* \*